US011810988B2

(12) United States Patent
Zhou et al.

(10) Patent No.: US 11,810,988 B2
(45) Date of Patent: Nov. 7, 2023

(54) INTEGRATED INFRARED CIRCULAR POLARIZATION DETECTOR WITH HIGH EXTINCTION RATIO AND DESIGN METHOD THEREOF

(71) Applicant: SHANGHAI INSTITUTE OF TECHNICAL PHYSICS, CHINESE ACADEMY OF SCIENCES, Shanghai (CN)

(72) Inventors: Jing Zhou, Shanghai (CN); Zeshi Chu, Shanghai (CN); Xu Dai, Shanghai (CN); Yu Yu, Shanghai (CN); Mengke Lan, Shanghai (CN); Shangkun Guo, Shanghai (CN); Jie Deng, Shanghai (CN); Xiaoshuang Chen, Shanghai (CN); Qingyuan Cai, Shanghai (CN); Fangzhe Li, Shanghai (CN); Zhaoyu Ji, Shanghai (CN)

(73) Assignee: Shanghai Institute of Technical Physics, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 17/762,352

(22) PCT Filed: Nov. 10, 2020

(86) PCT No.: PCT/CN2020/127783
§ 371 (c)(1),
(2) Date: Mar. 21, 2022

(87) PCT Pub. No.: WO2021/169401
PCT Pub. Date: Sep. 2, 2021

(65) Prior Publication Data
US 2022/0393049 A1 Dec. 8, 2022

(30) Foreign Application Priority Data
Feb. 28, 2020 (CN) .......................... 202010126506.2

(51) Int. Cl.
*H01L 31/0352* (2006.01)
*H01L 31/0304* (2006.01)

(52) U.S. Cl.
CPC ................ *H01L 31/035236* (2013.01); *H01L 31/03046* (2013.01)

(58) Field of Classification Search
CPC ....... H01L 31/035236; H01L 31/03046; H01L 31/09; H01L 31/184; H01L 31/02327; H01L 31/101; H01L 31/0304
See application file for complete search history.

(56) References Cited

U.S. PATENT DOCUMENTS

2013/0320470 A1* 12/2013 Nakajima ........... H01L 31/0352
257/431
2014/0319637 A1* 10/2014 Nakajima ........... H01L 31/0232
257/432

FOREIGN PATENT DOCUMENTS

CN 203800069 U 8/2014
CN 107665931 A 2/2018
(Continued)

OTHER PUBLICATIONS

Y. Liu, K. Song, Y. Qi, S. Gu and X. Zhao, "Investigation of Circularly Polarized Patch Antenna With Chiral Metamaterial," in IEEE Antennas and Wireless Propagation Letters, vol. 12, pp. 1359-1362, 2013, doi: 10.1109/LAWP.2013.2286191 (Year: 2013).*
(Continued)

*Primary Examiner* — Sitaramarao S Yechuri
(74) *Attorney, Agent, or Firm* — Paschall & Associates, LLC; Mark Goldberg

(57) ABSTRACT

The present disclosure provides an integrated infrared circular polarization detector with a high extinction ratio and a design method thereof. The detector structurally includes a metal reflective layer, a bottom electrode layer, a quantum well layer, a top electrode layer, and a two-dimensional
(Continued)

chiral metamaterial layer. Under circularly polarized light with the selected handedness, surface plasmon polariton waves are generated at the interface between the two-dimensional chiral metamaterial layer and the semiconductor, and has a main electric field component aligned with the absorption direction of the quantum wells, thereby enhancing the absorption of the quantum wells. Under circularly polarized light with the opposite handedness, since most of the optical power is reflected, surface plasmon polariton waves cannot be effectively excited, and the absorption of the quantum wells is extremely low, thus realizing the capability of infrared circular polarization detection with a high extinction ratio.

2 Claims, 4 Drawing Sheets

(56) References Cited

FOREIGN PATENT DOCUMENTS

| | | | |
|---|---|---|---|
| CN | 109742173 A | * | 5/2019 |
| CN | 109742173 B | | 6/2020 |
| CN | 111293188 A | | 10/2021 |
| JP | 2015049207 A | | 1/2019 |

OTHER PUBLICATIONS

Jingpei Hu et al., All-dieletric metasurface circular dichroism waveplate, Scientific Reports, DOI: 10.1038, published Jan. 31, 2017, 1-9.

* cited by examiner

INTEGRATED INFRARED CIRCULAR POLARIZATION DETECTOR WITH HIGH EXTINCTION RATIO AND DESIGN METHOD THEREOF

CROSS REFERENCE TO RELATED APPLICATIONS

This patent application claims the benefit and priority of Chinese Patent Application No. 202010126506.2, filed on Feb. 28, 2020, and to PCT application PCT/CN2020/127783, filed Nov. 10, 2020, the disclosure of which is incorporated by reference herein in its entirety as part of the present application.

TECHNICAL FIELD

The present disclosure relates to an integrated infrared circular polarization detector and a design method thereof, and in particular, to a chiral metamaterial integrated quantum-well infrared circular polarization detector with a high extinction ratio and a design method thereof.

BACKGROUND ART

Infrared circular polarization detection has important applications in many key areas related to national demands and people's livelihood. First of all, in terms of anti jamming imaging, circular polarization detection has received widespread attention due to its helicity retaining after passing through cloud or fog. When circularly polarized light propagates in a cloud composed of tiny water particles, the randomization rate of helicity is much lower than the randomization rate of propagation direction, so the circular polarization characteristics are maintained. Secondly, after circularly polarized light is directly reflected by a target, the helicity is reversed in most cases. However, the helicity of the stray light not reflected by the target remains unchanged. Thus, as long as the emitting light is a circularly polarized light and the detector only responds to the circularly polarized light with the opposite handedness, the interference of cloud, fog, and stray light can be suppressed significantly, and the definition of the target can be improved. In addition, when a circularly polarized light is scattered by different hydrometeors (such as raindrops and hails), its polarization characteristics (especially the helicity) are different. Therefore, circular polarization detection is also applicable to meteorological monitoring to identify rain cloud, hail cloud, thunder cloud, and the like. Moreover, infrared circular polarization detection plays an important role in molecular chirality detection, space optical communication, etc. Therefore, the development of infrared circular polarization detectors with high extinction ratios is of great significance.

At present, relatively mature infrared circular polarization detectors can be divided into the division-of-time type and the division-of-space type. A division-of-time device needs to be equipped with a linear polarizer and a quarter-wave plate. Circular polarization identification is realized by rotating the linear polarizer or the quarter-wave plate. Unfortunately, such a method relying on mechanical motion has the shortcomings of insufficient stability, low imaging rate, limited duration of each polarization state leading to low detection sensitivity. A division-of-space device may avoid the mechanical motion, but has the shortcomings of complicated optical paths, difficult assembly, and a large size. An integrated circular polarization detector, where micropolarizers are integrated directly with each pixel, can avoid the main shortcomings of the above two types of devices and shows the way forward. The circular polarization extinction ratios (CPERs) of integrated circular polarization detectors that have been reported are all lower than 2.5. There is no report about an infrared circular polarization detector with a high extinction ratio at present. Most infrared detection materials such as mercury cadmium telluride and quantum wells do not have circular dichroism and cannot distinguish circular polarization states. Inspired by the optical activity of chiral materials in nature, the integration of a chiral metamaterial and an infrared detection material can result in high-performance circular polarization infrared detection with high integration level and good stability.

SUMMARY

An objective of the present disclosure is to provide an integrated infrared circular polarization detector with a high extinction ratio and a design method thereof to solve the problem that a traditional infrared detector cannot realize infrared circular polarization detection.

FIG. 1 shows a unit structure of the circular polarization quantum-well infrared detector. In this integrated device, there is a bottom metal reflective plane 1, a bottom electrode layer 2, a quantum well layer 3, a top electrode layer 4, and a two-dimensional chiral metamaterial layer 5.

The metal reflective plane 1 may be a complete metal layer with a thickness $h_1$ which is not less than twice the skin depth of an electromagnetic wave in the metal. The reflective plane 1 may be made of a highly conductive metal.

The bottom electrode layer and the top electrode layer may be GaAs heavily doped with silicon, and the two electrodes have a thickness of $h_2$ and a thickness of $h_4$, respectively.

The quantum well layer may be made of a single-stack or multi-stack GaAs/Al$_x$Ga$_{1-x}$As or InGaAs/GaAs quantum wells, and the thickness of this layer is $h_3$.

The two-dimensional chiral metamaterial layer may be of a Z-shaped periodic antenna structure and made of a highly conductive metal. The two-dimensional chiral metamaterial layer may have a thickness of $h_5$ which is not less than twice the skin depth of an electromagnetic wave in the metal. The two-dimensional chiral metamaterial layer is periodic in the x- and the y-direction. The period in the x-direction ($P_x$) and that in the y-direction ($P_y$) are within the range from a quarter wavelength to a half wavelength of the light. A single period of the Z-shaped antenna may have a width of $W_1$ at the middle thereof, a width of $W_2$ at both ends thereof, and a length of L at an outer side thereof. $W_1 > W_2$. $W_1$ is within the range from a quarter to a half of $P_y$. $L > P_x/2$.

When the device receives left-handed circularly polarized (LCP) light, reflected light is significantly reduced due to the destructive interference of the principle polarization radiation and the cross-polarization radiation at the resonant wavelength. Meanwhile, the Z-shaped antenna array which is periodically arranged in the y-direction can excite a surface plasmon polariton wave at the metal-semiconductor interface. Thus, most of the incident light is efficiently coupled into this mode. Since a main electric field component of this mode is along the Z-axis perpendicular to the plane of the quantum wells, the absorption of the quantum wells is significantly enhanced. When the incident light is changed to a right-handed circular polarization one, the reflectivity of the structure is high due to the constructive interference of the principle polarization radiation and the cross-polarization radiation at the resonant wavelength, the surface plasmon polariton wave at the interface between the top metal and the semiconductor cannot being effectively excited, and a very weak electric field is generated in the composite structure. Moreover, the electric field is not mainly perpendicular to the plane of the quantum well, thus resulting in extremely low light absorption of the quantum well. The resonant wavelength of surface plasmon polariton wave propagating in the x-direction can be achieved by adjusting the structure parameter of the chiral metamaterial, especially the period $P_x$ of the Z-shaped antenna in the x-direction.

In particular, a quantum well material is an anisotropic material that only absorbs the electric field perpendicular to the plane of the quantum wells with low quantum efficiency. Under LCP light, the electric field component of the surface plasmon polariton wave is mainly in the Z-direction aligned with the absorption direction of the quantum wells, thereby enhancing the quantum efficiency of the quantum wells. In case of RCP light, the quantum wells have extremely low absorption for the light directly incident on the material and for the light scattered by the edges or corners of a metal strip. Thus, an infrared quantum well detector with a high circular polarization extinction ratio is obtained, and the quantum efficiency of the quantum wells for the circularly polarized light with the selected handedness is significantly enhanced.

In addition, absorption enhancement for the RCP light and absorption suppression for the LCP light can be simply realized by changing the chirality of the Z-shaped antenna (as shown in FIG. 5) without changing other structural parameters.

The present disclosure has the following advantages:
1. The detector combines a chiral metamaterial with a quantum well infrared detector. The chiral metamaterial has circular polarization selectivity. The surface plasmon polariton wave at the interface between the Z-shaped antenna and the semiconductor can be efficiently excited by circularly polarized light with the selected handedness, but not by that with the opposite handedness. The electric field component of the surface plasmon polariton wave is mainly in the Z-direction aligned with the absorption direction of the quantum wells. Therefore, the light absorption of the quantum wells can be enhanced for circularly polarized light with the selected handedness and the absorption of the quantum wells is extremely low for the circularly polarized light with the opposite handedness. Thus, the circular polarization extinction ratio of the device is increased.
2. The chiral metamaterial is circular polarization selectivity, and the quantum well infrared detector is polarization selectivity. Based on the dual-polarization selection, the circular polarization detection with a high extinction ratio, which is at least one order of magnitude greater than that of a general integrated circular polarization detector, is achieved.
3. A local strong light field that fully overlaps the quantum well region is generated by exciting the surface plasmon polariton wave; thereby the absorptivity and the quantum efficiency of the quantum well are enhanced while achieving circular polarization identification with a high extinction ratio.
4. The detector combines the chiral metamaterial and the quantum well to obtain the capability of circular polarization detection with a high extinction ratio without the use of external optical elements. The detector has the advantages of high integration, relative easy fabrication, small size, high stability and reliability. Further, it can be integrated with linear polarization quantum well detectors at the pixel level to realize integrated full Stokes polarization detection.

DETAILED DESCRIPTION OF THE EMBODIMENTS

Figure 1:
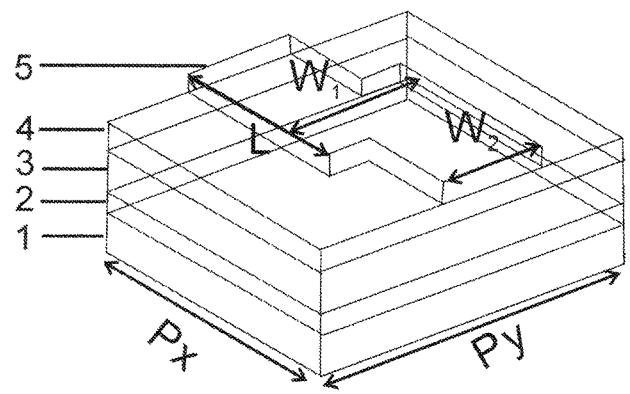
FIG. 1 is a diagram of an integrated circular polarization quantum well infrared detector.

The design and fabrication method of a circular polarization quantum-well infrared detector provided in the present disclosure are completely compatible with a focal plane array. For ease of description, a specific embodiment of the present disclosure will be described in detail by taking a $GaAs/Al_xGa_{1-x}As$ quantum-well circular polarization detector operating at the wavelength of 12 μm for example.

1. First, a bottom electrode layer (GaAs heavily doped with silicon at a doping concentration of $2\times10^{17}$ cm$^{-3}$), a multi-stack $GaAs/Al_xGa_{1-x}As$ quantum well layer, and a top electrode layer (GaAs heavily doped with silicon at a doping concentration of $2\times10^{17}$ cm$^{-3}$) are grown on a GaAs substrate by molecular beam epitaxy.
2. A mesa of a quantum well infrared detection device is defined by lithography. The developed area of a photoresist will be etched, while the undeveloped area of the photoresist will be protected.
3. The quantum well sample is etched to the bottom electrode to form the mesas and the common electrodes by chemical etching or inductively coupled plasma (ICP).
4. A pattern is defined by lithography, and with a photoresist as a mask, electron beam evaporation is performed to deposit AuGe/Ni/Au. A lift-off process is then conducted to obtain metal contacts for the top electrode and the bottom electrode. The Schottky barrier between the AuGe/Ni/Au and the semiconductor material is eliminated by a rapid annealing process to form an ohmic contact.
5. Electron beam evaporation is performed to deposit a Ti (50 nm)/Au (150 nm) metal layer as a bottom metal reflective layer.
6. Plasma enhanced vapor deposition (PECVD) is adopted to grow a 300 nm $SiN_x$ film on the surface of the chip as a passivation layer, which plays a main role in isolating air and water vapor and shielding surface electric leakage to protect the chip.
7. Open windows in the $SiN_x$ film are defined by lithography, and formed by reactive ion etching (RIE), allowing for indium bump joining between the chip and the read out integrated circuit.

8. Indium bumps with a height about 7 μm are prepared at the windows in the $SiN_x$ film by lithography, thermal evaporation, and lift-off process.
9. The device is interconnected with a read out circuit on the sapphire wafer by flip-chip bonding.
10. An appropriate amount of epoxy glue is injected into a gap between the chip and the sapphire wafer by a glue dispenser. After being cured, the epoxy glue can protect the internal structure of the device and cushion the effect of the thermal expansion coefficient mismatch within the device.
11. The GaAs substrate is removed by mechanical polishing and selective etching.
12. A two-dimensional chiral metamaterial structure is prepared by electron beam lithography.

EXAMPLE

The quantum-well circular polarization detector of this example is designed for the detection wavelength of 12 μm, and the metal is gold. The chiral metamaterial is a Z-shaped metal grating. After electromagnetic simulation and optimization, the structure size of the periodic unit is obtained as follows: $P_x$=3.85 μm, $P_y$=3 μm, $W_1$=0.6 μm, $W_2$=1 μm, L=2.5 μm, and $h_1$=50 nm.

The quantum well layer includes 9 stacks of GaAs/$Al_{0.55}Ga_{0.45}As$ materials. Each stack has a thickness of 66.5 nm, including a 60 nm $Al_{0.55}Ga_{0.45}As$ barrier layer and a 6.5 nm GaAs potential well layer. The top electrode layer and the bottom electrode layer are GaAs and each has a thickness of 200 nm. The metal reflective layer is a gold film with a thickness of 100-200 nm.

Figure 2:
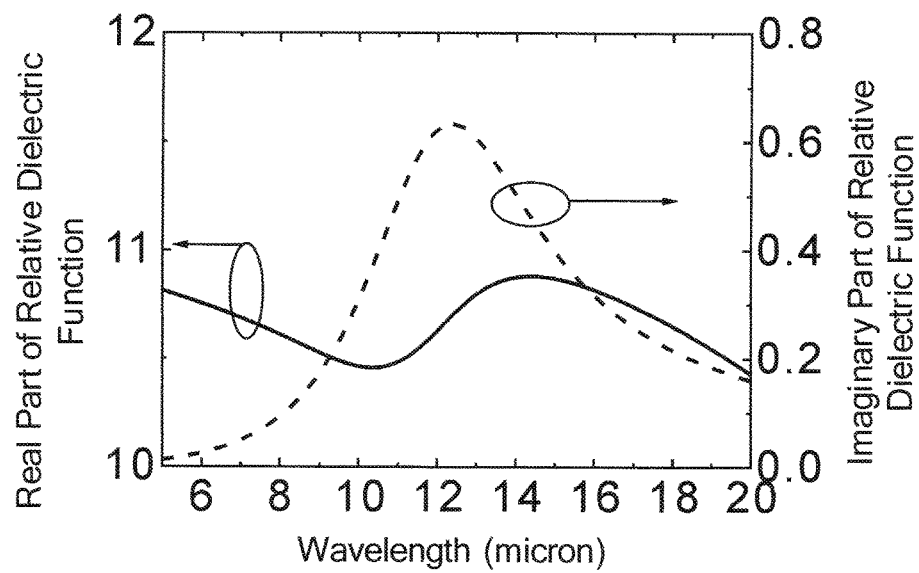
FIG. 2 shows the Z-component of a relative permittivity of a quantum well.
Figure 3:
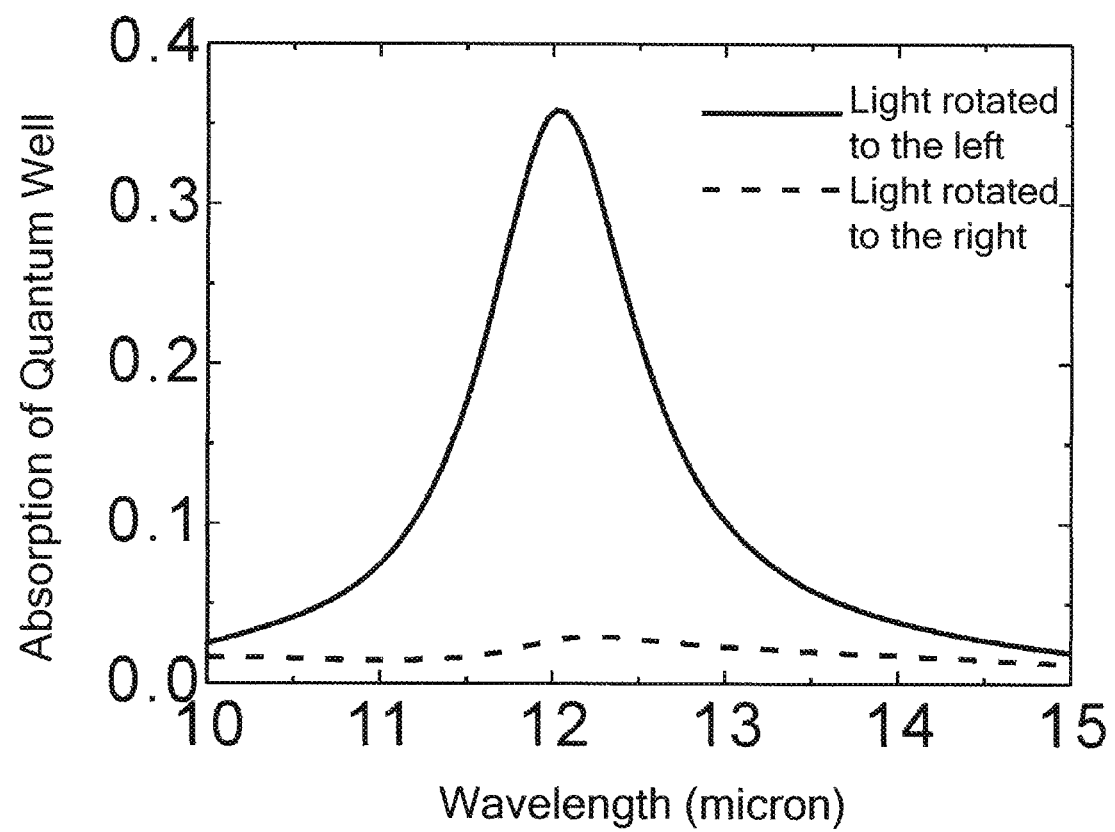
FIG. 3 shows the absorption spectra of the quantum wells in the chiral metamaterial integrated quantum well infrared detector under LCP light (full line) and RCP light (dotted line) illumination.
Figure 4:
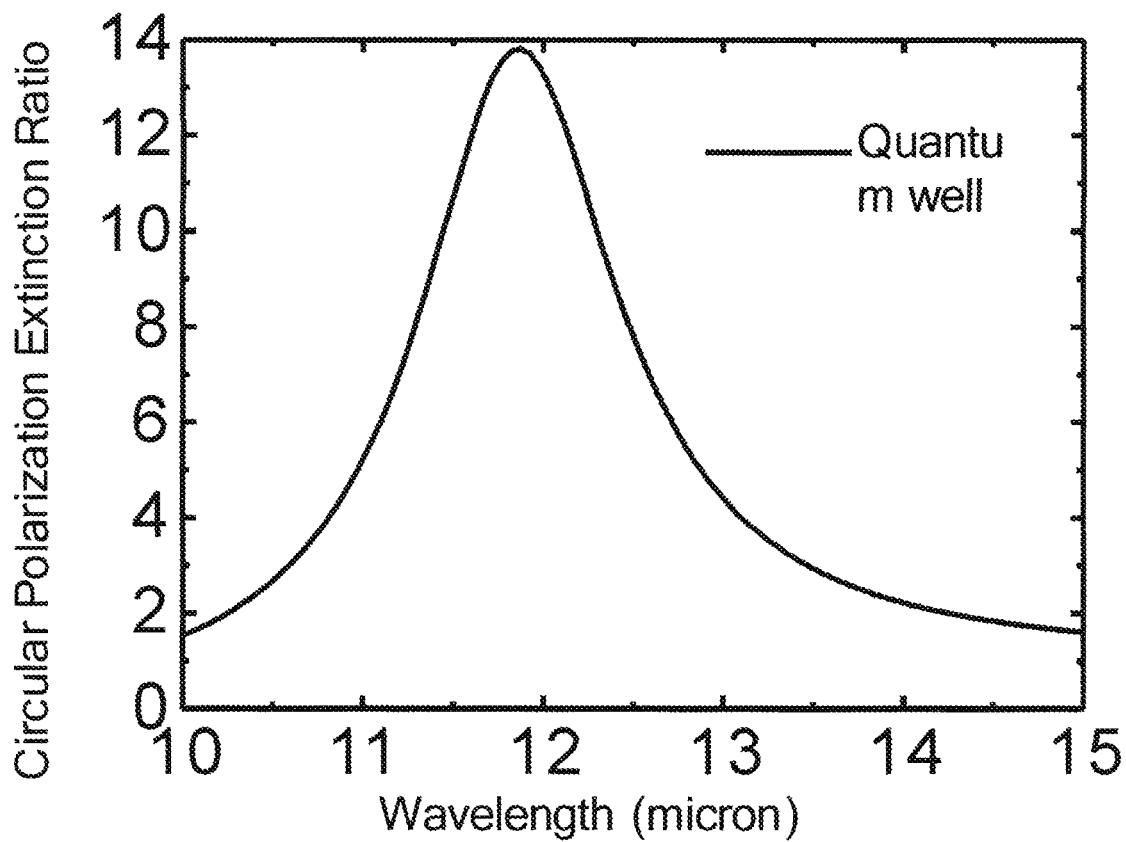
FIG. 4 shows a circular polarization extinction ratio of the light absorption in the quantum wells.
Figure 5:
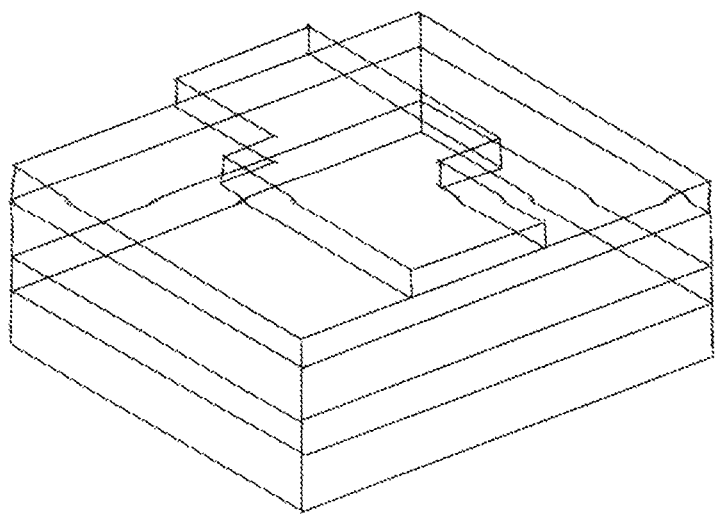
FIG. 5 is a diagram of the enantiomer of the Z-shaped antenna for LCP light absorption.
Figure 6:
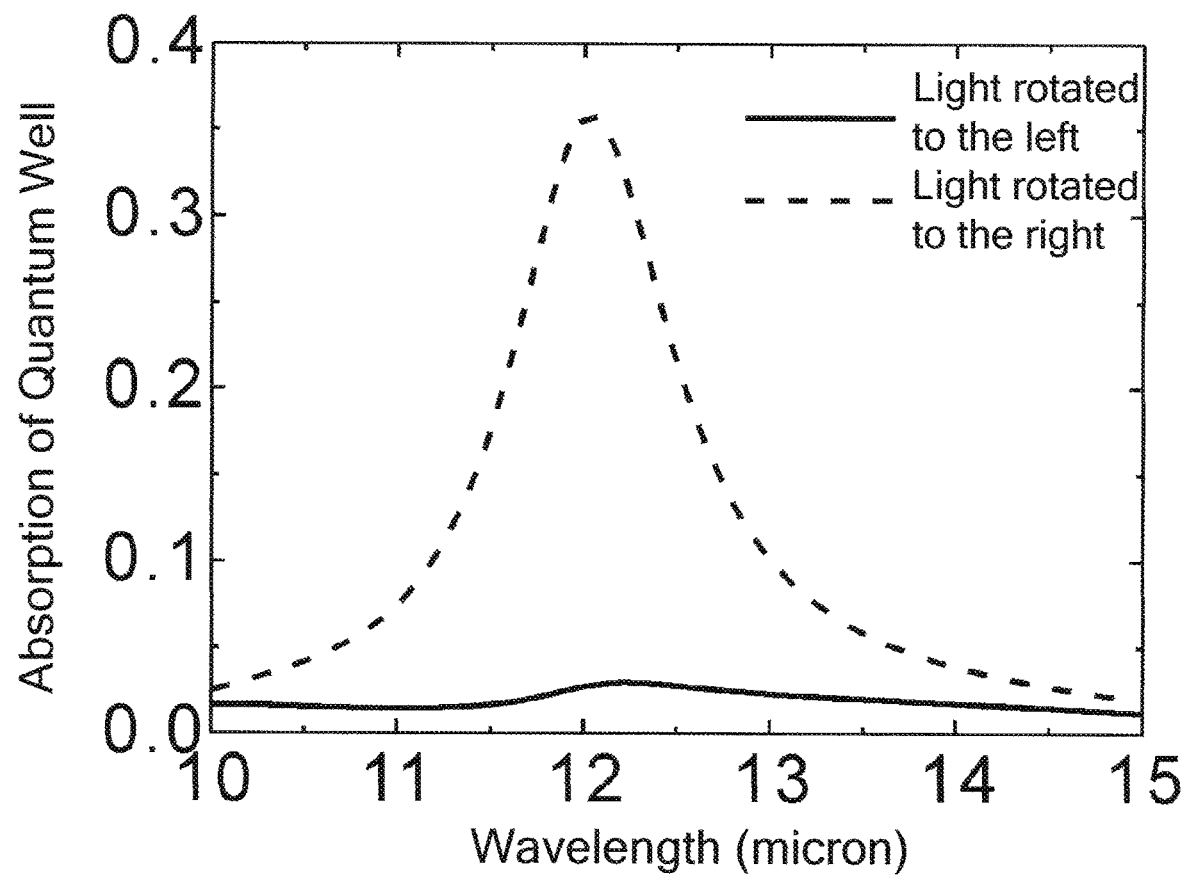
FIG. 6 shows the absorption spectra of the quantum wells in the composite structure in FIG. 5 under LCP light (full line) and RCP light illumination.

FIG. 2 shows a dielectric function of the quantum well in the Z-direction. The absorption and circular polarization extinction ratios of the quantum wells in the chiral metamaterial integrated QWIP with optimized structural parameters are shown in FIGS. 3 and 4, and the circular polarization extinction ratio reaches 14.

What is claimed is:

1. An integrated infrared circular polarization detector, wherein
the detector structurally comprises a bottom metal reflective surface (1), a bottom electrode layer (2), a quantum well layer (3), a top electrode layer (4) and a two-dimensional chiral metamaterial layer (5) in sequence from bottom to top, the two-dimensional chiral metamaterial layer (5) is comprised of Z-shaped antenna structures arranged periodically in an x-direction and a y-direction, so as to excite a surface plasmon polariton wave upon receiving circularly polarized light with selected handedness and not excite the surface plasmon polariton wave upon receiving circularly polarized light with opposite handedness;
the bottom metal reflective plane (1) is a metal reflective layer with a thickness of $h_1$ which is not less than twice the skin depth of an electromagnetic wave in the metal reflective layer; and the metal reflective plane (1) is made of a highly conductive metal;
the bottom electrode layer (2) and the top electrode layer (4) are GaAs heavily doped with silicon at a doping concentration of $2\times10^{17}$ $cm^{-3}$; and
the quantum well layer (3) is made of a single-stack or a multi-stack semiconductor quantum well composed of $GaAs/Al_xGa_{1-x}As$ or InGaAs/GaAs.

2. The integrated infrared circular polarization detector according to claim 1, wherein the two-dimensional chiral metamaterial layer (5) is designed as follows:
fabricating the two-dimensional chiral metamaterial layer (5) with a highly conductive metal, wherein the two-dimensional chiral metamaterial layer (5) has a thickness not less than twice the skin depth of an electromagnetic wave in the metal, and is periodic in the x-direction and the y-direction, with; a period in the x-direction ($P_x$) and a period in the y-direction ($P_y$) being a quarter wavelength to a half of wavelength of light, and the two-dimensional chiral metamaterial layer (5) has a width of $W_2$ at both ends thereof, a length of L at two outer sides in protruding positions in the x-direction, and a width of $W_1$ between the two outer sides in the y-direction, with $W_1>W_2$, $W_1$ being a quarter to a half of $P_y$, and $L>P_x/2$.

* * * * *